United States Patent
Lee et al.

(10) Patent No.: US 7,498,196 B2
(45) Date of Patent: Mar. 3, 2009

(54) STRUCTURE AND MANUFACTURING METHOD OF CHIP SCALE PACKAGE

(75) Inventors: Jin-Yuan Lee, Hsin-Chu (TW); Ching-Cheng Huang, Hsin-Chu (TW); Mou-Shiung Lin, Hsin-Chu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 09/821,546

(22) Filed: Mar. 30, 2001

(65) Prior Publication Data

US 2002/0140069 A1    Oct. 3, 2002

(51) Int. Cl.
*H01L 21/44* (2006.01)
*H01L 21/48* (2006.01)

(52) U.S. Cl. .................. 438/108; 438/106; 438/614

(58) Field of Classification Search .......... 438/106, 438/108, 614; 257/783, 678, 778, 781, E21.503, 257/E21.508, E21.511, E23.021
See application file for complete search history.

(56) References Cited

U.S. PATENT DOCUMENTS

| | | | | |
|---|---|---|---|---|
| 4,606,962 A * | 8/1986 | Reylek et al. | ............ | 428/148 |
| 5,480,835 A * | 1/1996 | Carney et al. | ............ | 438/614 |
| 5,734,201 A | 3/1998 | Djennas et al. | ............ | 257/783 |
| 5,846,875 A * | 12/1998 | Haji | ............ | 438/614 |
| 5,882,956 A * | 3/1999 | Umehara et al. | ............ | 438/114 |
| 5,914,533 A | 6/1999 | Frech et al. | ............ | 257/700 |
| 5,994,766 A | 11/1999 | Shenoy et al. | ............ | 257/659 |
| 6,064,114 A | 5/2000 | Higgins, III | ............ | 257/698 |
| 6,075,710 A | 6/2000 | Lau | ............ | 361/760 |
| 6,118,183 A | 9/2000 | Umehara et al. | ............ | 257/783 |
| 6,137,164 A | 10/2000 | Yew et al. | ............ | 257/686 |
| 6,165,885 A * | 12/2000 | Gaynes et al. | ............ | 438/612 |
| 6,232,147 B1 * | 5/2001 | Matsuki et al. | ............ | 438/108 |
| 6,265,782 B1 * | 7/2001 | Yamamoto et al. | ............ | 257/783 |
| 6,306,680 B1 * | 10/2001 | Fillion et al. | ............ | 438/106 |
| 6,312,972 B1 * | 11/2001 | Blackshear | ............ | 438/106 |
| 6,355,507 B1 * | 3/2002 | Fanworth | ............ | 438/127 |
| 6,507,122 B2 * | 1/2003 | Blackshear | ............ | 257/787 |
| 2001/0021541 A1 * | 9/2001 | Akram et al. | ............ | 438/106 |
| 2002/0163055 A1 * | 11/2002 | Thomas | ............ | 257/459 |
| 2002/0170746 A1 * | 11/2002 | Master et al. | ............ | 174/256 |

* cited by examiner

*Primary Examiner*—Hung Vu
(74) *Attorney, Agent, or Firm*—Saile Ackerman LLC; Stephen B. Ackerman; Rosemary L. S. Pike

(57) ABSTRACT

A Chip Scale Package (CSP) and a method of forming the same are disclosed. Single chips without the conventional ball mountings, are first attached to an adhesive-substrate (adsubstrate) composite having openings that correspond to the input/output (I/O) pads on the single chips to form a composite chip package. Ball mounting is then performed over the openings, thus connecting the I/O pads at the chip sites to the next level of packaging directly. In another embodiment, the adhesive layer is formed on the wafer side first to form an adwafer, which is then die sawed in CSPs. Then the CSPs with the adhesive already on them are bonded to a substrate. The composite chip package may optionally be encapsulated with a molding material. The CSPs provide integrated and shorter chip connections especially suited for high frequency circuit applications, and can leverage the currently existing test infrastructure.

141 Claims, 10 Drawing Sheets

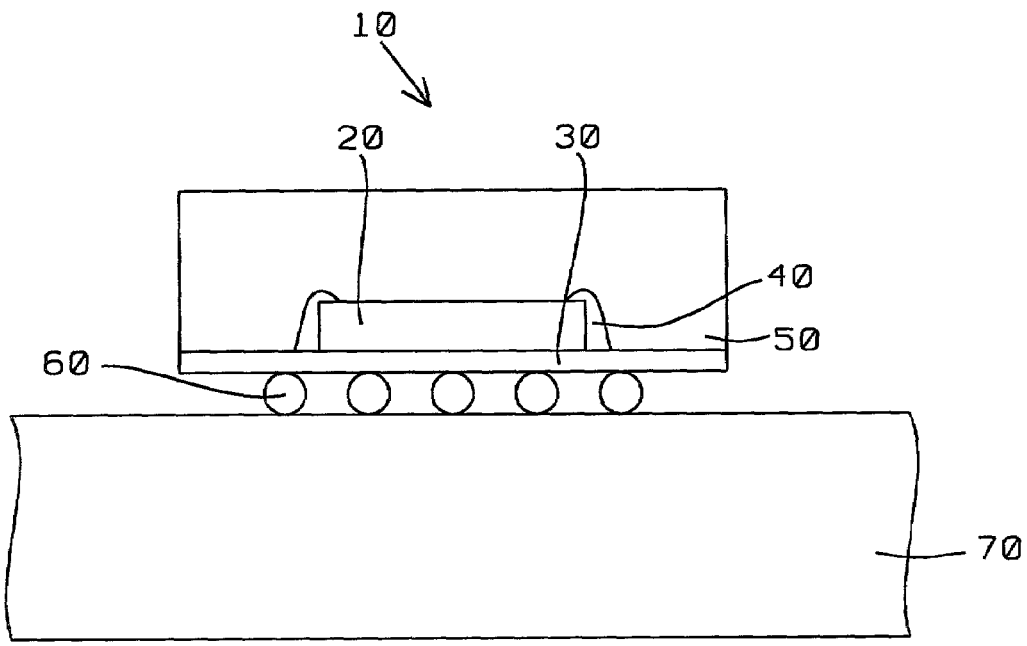
FIG. 1 - Prior Art
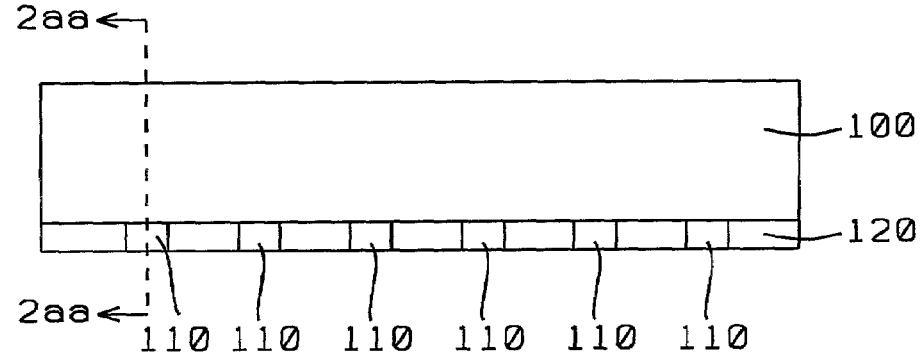
FIG. 2a
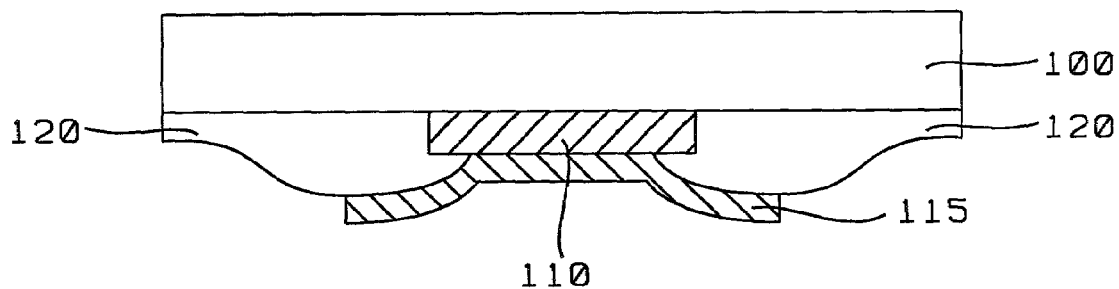
FIG. 2aa

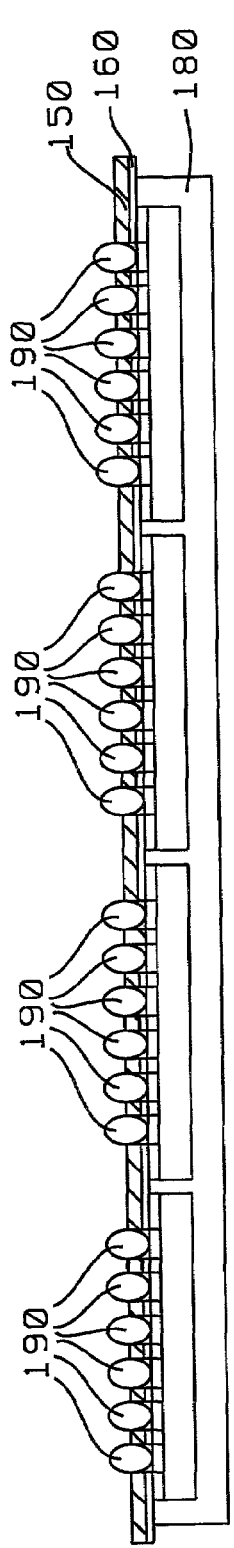
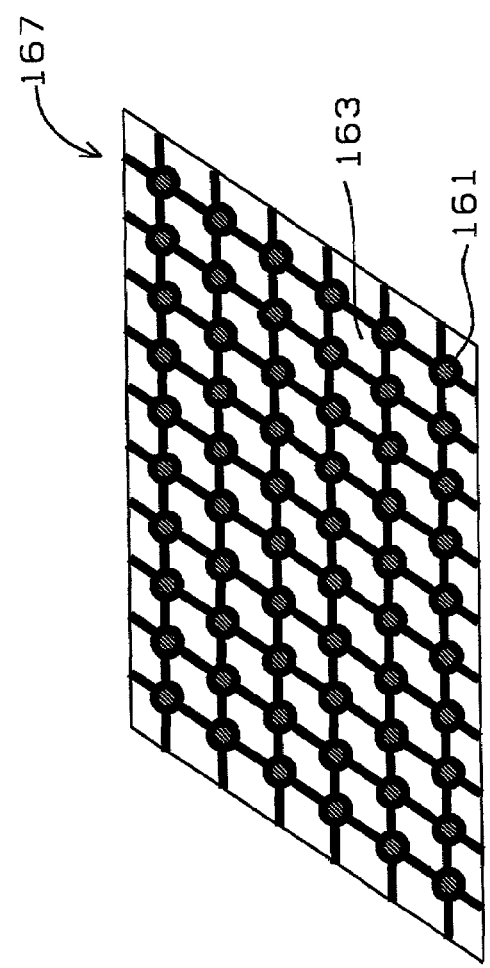
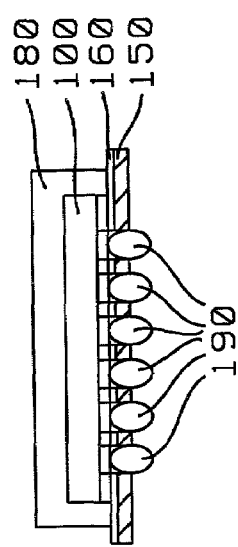
FIG. 2h
FIG. 2j
FIG. 2i

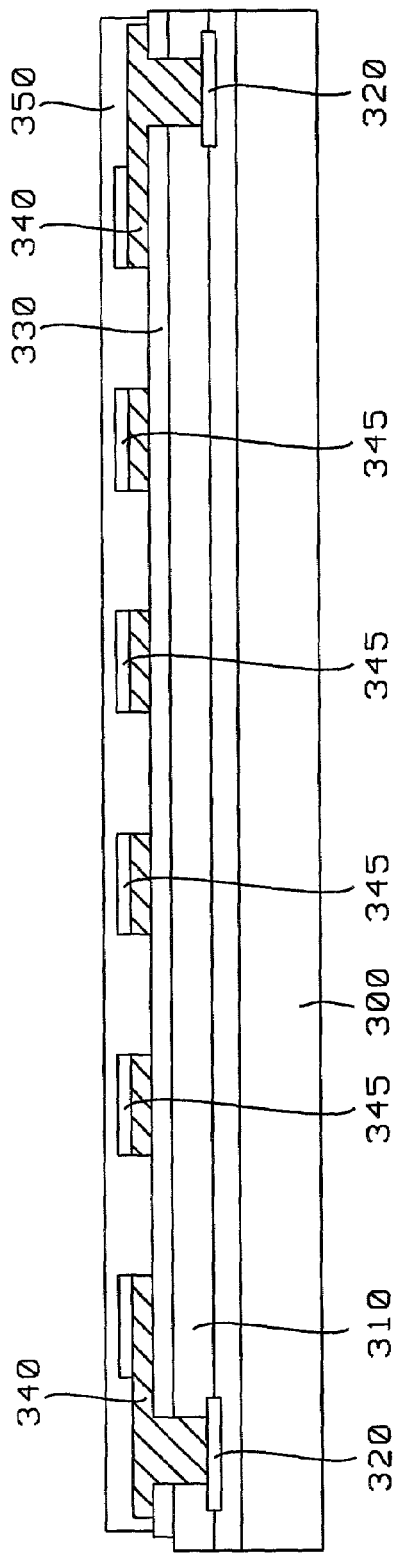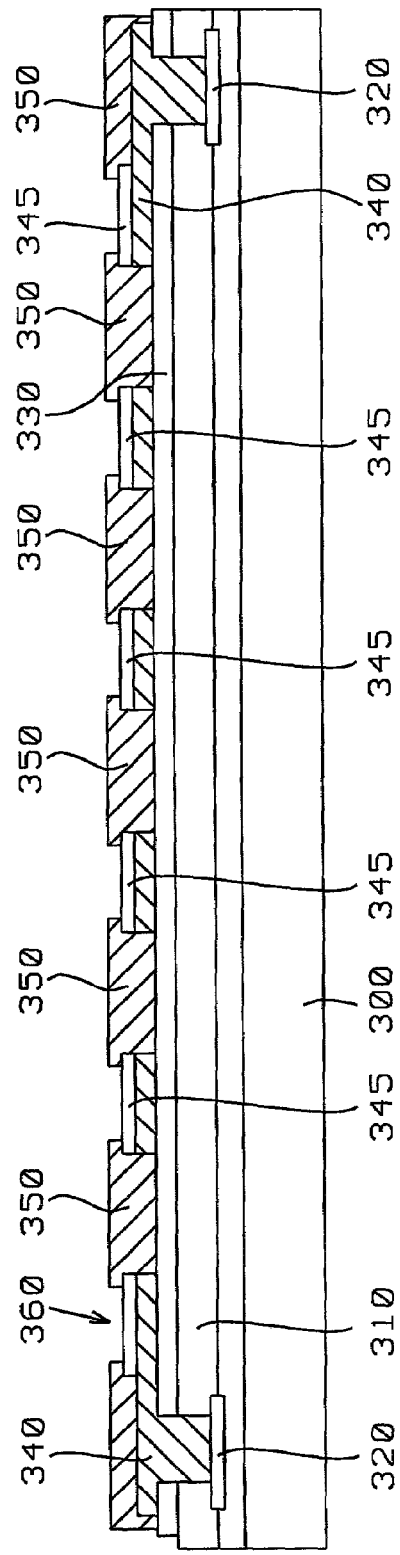
FIG. 3a
FIG. 3b

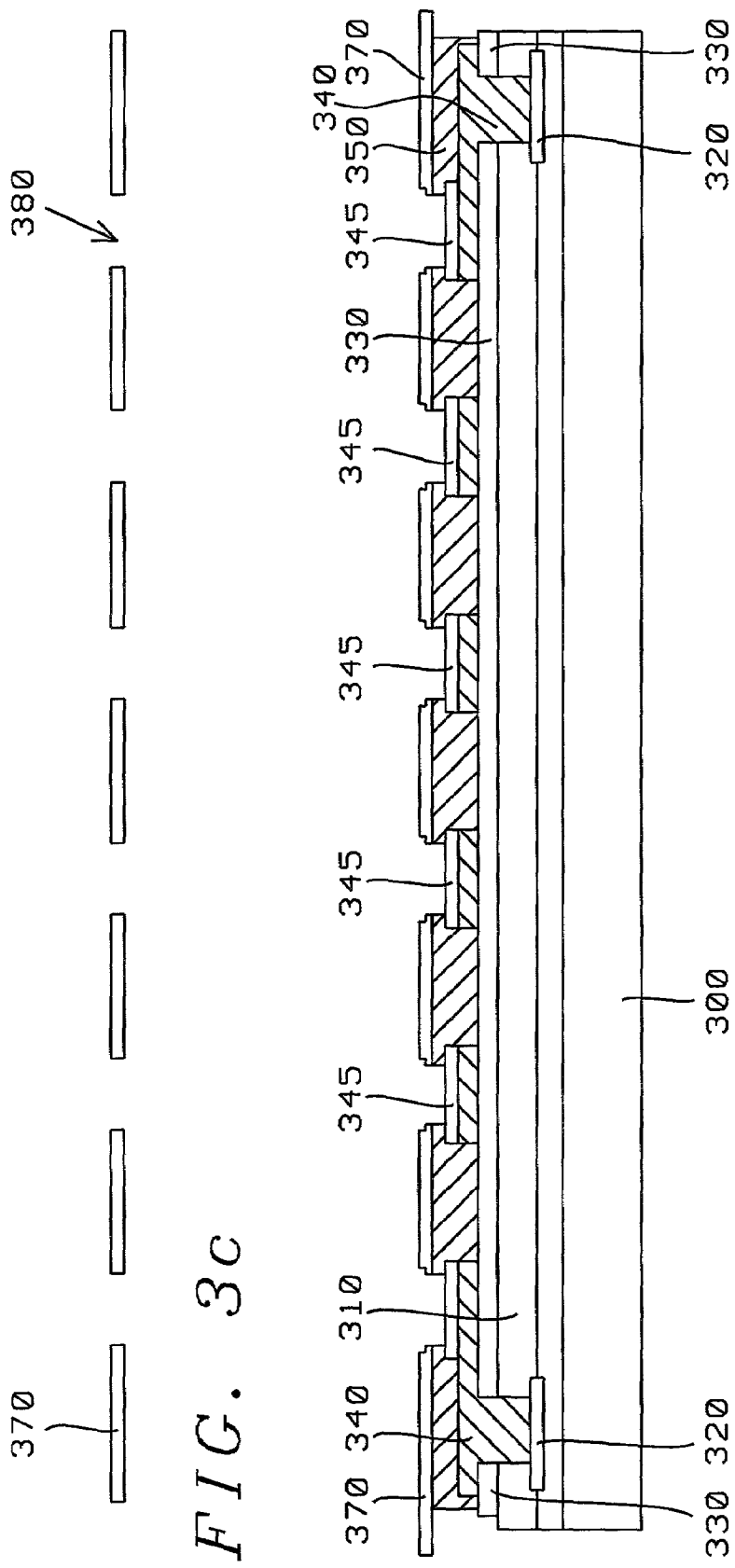

STRUCTURE AND MANUFACTURING METHOD OF CHIP SCALE PACKAGE

BACKGROUND OF THE INVENTION (1) Field of the Invention

The present invention relates to the manufacture of integrated circuit (IC) chips, and in particular to the packaging of chips at the chip level. At the same time, packaging of chips relates to chip bonding, including the current wire bonding, to Chip Scale Packaging (CSP) test fixture concerns, and the attendant reliability concerns.

(2) Description of the Related Art

Packaging of IC chips determines to a large extent the performance of the system of which the chips are the smallest building blocks. As-one chip must communicate with one or more other neighboring chips in order to perform a system function, the method by which the chips are packaged and interconnected makes a difference in their speed of communication. For example, current mini-BGA (Ball-Grid-Array) packages using wire bonding as interconnection are not as effective in high frequency circuit applications. Also, chip scale packaging (CSP) is important in determining the type of fixtures that must be used for testing. It is disclosed later in the embodiments of the present invention a CSP package and a method of manufacturing the same which substantially improves the performance of the IC chips as well as the testing cost of the chips.

As is known in the art, integrated circuits are formed on a silicon wafer which is then diced or cut to form individual die, also called chips. The circuits which are interconnected in each chip terminate at terminals on the chip. The appropriate chips are then interconnected with each other by bonding those terminals onto a card having its own interconnections. Depending upon the complexity and function of the final machine that is to be built, this first level package may in turn be interconnected with other first level cards by connecting the cards onto a second level package, usually called a board.

The chip level interconnection forming the first level package is usually performed using wirebonding (WB), tape automated bonding (TAB), or flip-chip solder connection, sometimes referred to as controlled collapse chip connection (C4). A detailed description of each of these interconnection schemes will not be given here so as to not obscure the key aspects of the present invention, and also, as they are not necessary to the understanding of the teachings of the present invention.

A conventional first level mini-BGA package, (10), is shown in prior art FIG. 1. The die, or chip (20) is wire-bonded (40) to substrate (30), which in turn is connected to second level package (70) through solder connections (60). The mini-BGA package Ls always encapsulated in a molding material (50). It will be known to those skilled in the art that it would be desirable to eliminate wires (40). Such a method is disclosed later in the embodiments of the present invention. Some other prior methods of making connections to chips are disclosed in U.S. Pat. Nos. 5,994,76 by Shenoy et al., 6,118,183 by Umehara, et al., 6,137,164 by Yew et al., 5,734,201 by Djennas et al, and 5,914,533 by Frech et al., where they use redistribution layers. Lau, on the other hand, shows a low-cost surface mount compatible land-grid array (LGA) chip scale package (CSP) for packaging solder-bumped flip chips. Higgins also discloses a CSP mounted to a substrate using direct chip attach (DCA) method.

The present invention, as disclosed later, differs from prior art in that a CSP is formed by integrating a redistributed chip on a substrate. The I/O solder balls are first mounted through the substrate vias, which in turn are connected to the chip I/O pads. The substrate is attached to the chip by an adhesive.

SUMMARY OF THE INVENTION

It is therefore an object of this invention to provide a Chip Scale Package (CSP) having improved chip attachment especially suited for high frequency circuit application.

It is another object of the present invention to provide a more reliable CSP than current CSP.

It is still another object of the present invention to provide a CSP which leverages current test infrastructure to be more cost effective.

It is yet another object of the present invention to provide a method of forming CSP with improved interconnections.

It is an overall object of the present invention to provide a method of attaching chips directly to an adhesive-substrate (adsubstrate) as well as attaching an adhesive-wafer (adwafer) directly to a substrate in order to form CSPs with minimized interconnection lengths and hence, enhanced circuit speed.

The objects of the invention are accomplished by providing a silicon chip having I/O pads; an under-ball metallurgy (UBM) layer on the surface of said I/O pads; a substrate with an adhesive (adsubstrate), and having openings corresponding to the locations of said I/O pads; and ball mountings formed over said adsubstrate and reaching said UBM layer over said I/O pads on said chip.

The objects are further accomplished by providing a wafer having a plurality of chip sites with I/O pads; forming an under-ball metal (UBM) layer over said I/O pads; forming an adhesive layer over said UBM layer on said wafer to form an adwafer; forming openings in said adhesive layer on said adwafer to reach said I/O pads underlying said UBM layer; die sawing said adwafer to form said chip scale package (CSP); providing a substrate having openings corresponding to said I/O pads; attaching said CSP with said adhesive to said substrate; and forming ball mountings on said openings on said substrate to attach to said I/O pads on said CSP.

BRIEF DESCRIPTION OF THE DRAWINGS

FIG. 1 is a cross-sectional view of a portion of a conventional mini-BGA, according to prior art.

FIG. 2a is a cross-sectional view of a portion of a semiconductor chip showing the forming of an area array I/O pads, according to the present invention.

FIG. 2aa is a transverse cross-sectional view of a portion of the semiconductor chip of FIG. 2a showing the UBM layer on the I/O pads, according to the present invention.

FIG. 2h is a cross-sectional view of a portion of the encapsulate chip package of FIG. 2g showing the forming of ball mounts, according to the present invention.

FIG. 2i is a cross-sectional view of a portion of the chip scale package (CSP) of the present invention after sawing off of the same from the chip package of FIG. 2h, according to the present invention.

FIG. 2j is a top view of a portion of the patterned stencil where solid areas (161) prevent the adhesive material printing to the substrate while open areas (163) allow the adhesive material to print on the substrate, thus forming the adsubstrate of FIG. 2e, according to the present invention.

FIG. 3a is a cross-sectional view of a portion of a wafer showing the forming of an adhesive layer, according to the present invention.

FIG. 3b is a cross-sectional view of a portion of the wafer of FIG. 3a showing the opening of the area array I/O pads, according to the present invention.

FIG. 3c is a cross-sectional view of a portion of a substrate showing the area array openings, according to the present invention.

FIG. 3d is a cross-sectional view of a portion of the substrate of FIG. 3c and of the wafer of FIG. 3b showing the attachment to each other, according to the present invention.

DESCRIPTION OF THE PREFERRED EMBODIMENTS

Figure 2B:
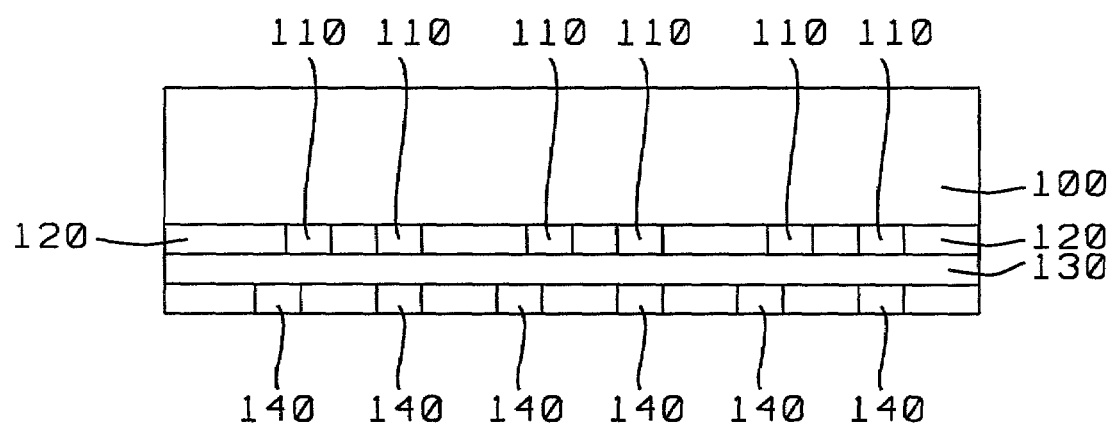
FIG. 2b is a cross-sectional view of a portion of a semiconductor chip showing the redistribution of I/O pads in a redistribution layer to form an area array of I/O pads, according to the present invention.

Referring now to the drawings, that is, to FIGS. 2a-2i, and FIGS. 3a-3g, there are shown steps of forming a Chip Scale Package (CSP) with improved interconnections.

More specifically, FIGS. 2a and 2b show two single chips die sawed from a wafer, preferably silicon. Chip (100) in FIG. 2a is either already designed to have an area array (AA) of input-output (I/O) pads (110) in passivation layer (120), or, optionally, the same chip in FIG. 2b has normal design I/O pads which have subsequently been redistributed in a re-routing (RR) layer (130) to form redistributed AA pads (140) as shown in FIG. 2b. An under-ball metallurgy layer, comprising nickel and copper, that is, (UBM) layer (115), is also formed over pads (110) or (140), better seen in cross-sectional view in FIG. 2aa. It is important that the pads on chips are generally in an area array configuration for easier connection to the next level of packaging, as is known in the art.

It is also known in the art that chip sites are first formed on a semiconductor substrate to form a wafer, where the substrate is provided with pads (110/115) or (140/115) that are connected to underlying multi-level metal layers through intervening insulating dielectric layers, and ultimately to integrated circuit devices that have already been conventionally formed within and on the substrate. These conventional steps are well known in the art and as they are not significant to the invention, they are not described in detail here in order not to unnecessarily obscure the present invention. However, it is described below in the embodiments of the present invention a new method of forming a chip scale package (CSP) where the I/O ball connections are directly reflowed to the chip pads through vias formed in an intervening next level of substrate.

Figure 2C:
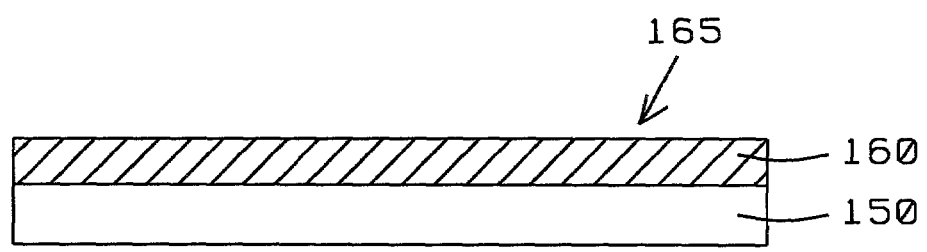
FIG. 2c is a cross-sectional view of a portion of a composite adsubstrate structure comprising an adhesive layer formed over a substrate, according to the present invention.
Figure 2D:
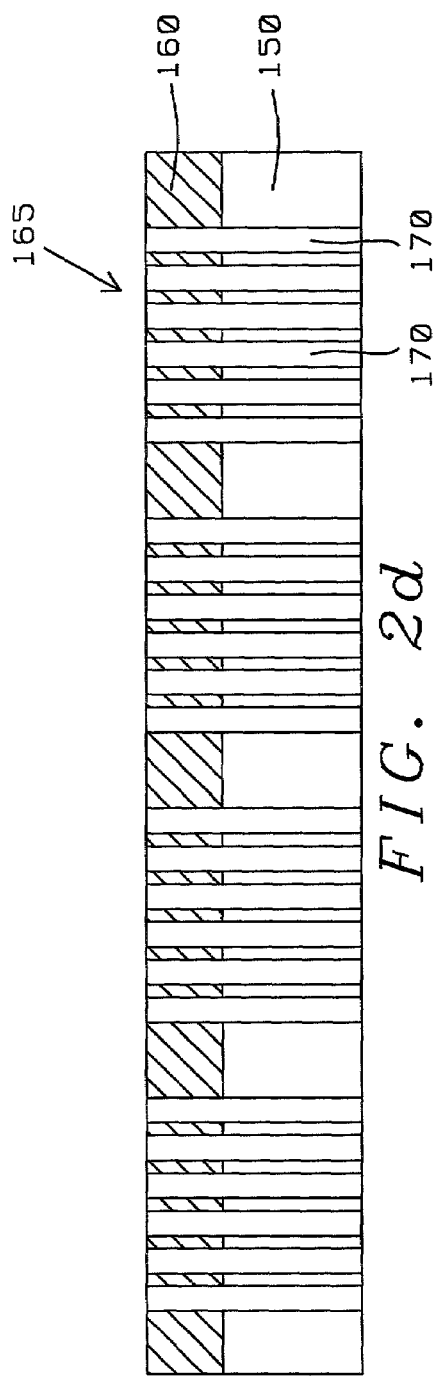
FIG. 2d is a cross-sectional view of a portion of the adsubstrate of FIG. 2c showing the forming of through via holes, according to the present invention.
Figure 2E:
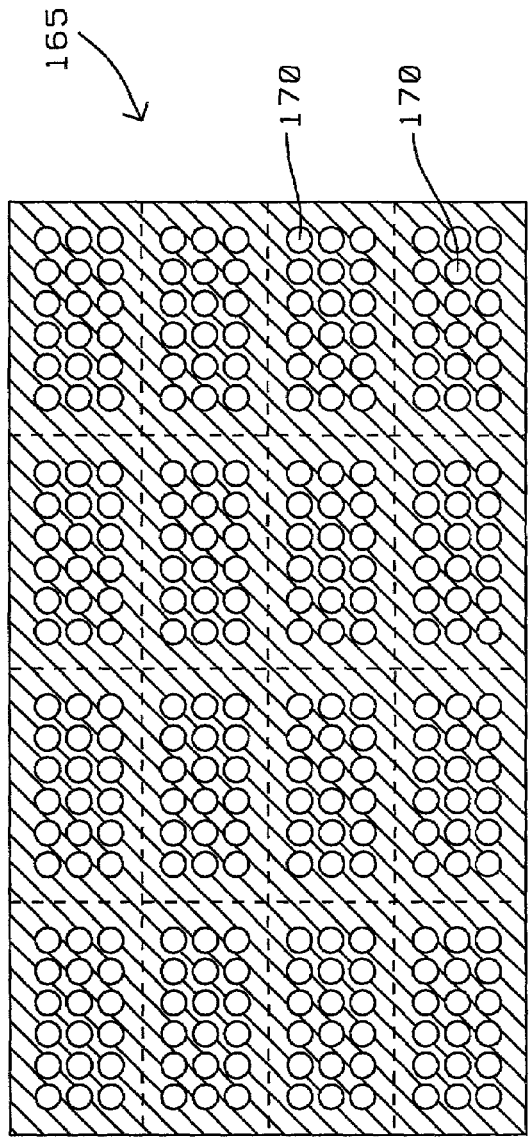
FIG. 2e is a top view of a portion the adsubstrate of FIG. 2d showing the area array of via openings, according to the present invention.

Thus, as a key aspect of the present invention, substrate (150), preferably a bismaleimide triazine (BT), having a thickness between about 150 to 300 micrometers (μm) is [mounted with] adhered to an adhesive layer (160), having a thickness between about 10 to 100 μm. Layer (160) can be a polyimide thermocompression adhesive SPA made by Nippon Steel Chemical. The adhesive and the substrate together form an "adsubstrate" composite structure, reference numeral (165), as shown in FIG. 2c. The composite adsubstrate is then either mechanically drilled, or, preferably laser drilled with an area array of via openings (170) that correspond to AA I/O pads (110) or (140) on the chip, as shown in FIG. 2d. A top view of the adsubstrate with AA openings is also shown in FIG. 2e.

Figure 2F:
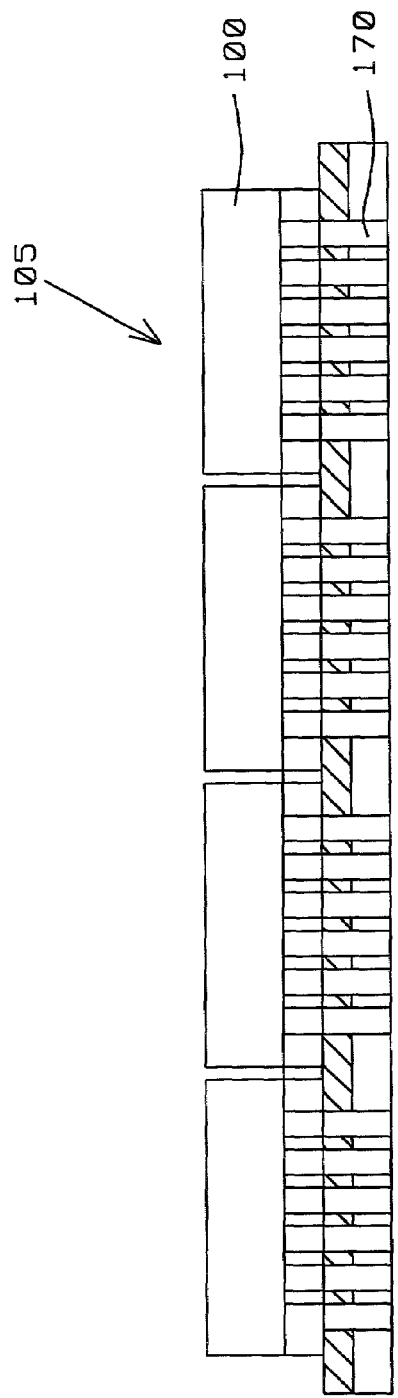
FIG. 2f is a cross-sectional view of a portion of a chip package formed by adhering a multiplicity of chips to the adsubstrate of FIG. 2d, according to the present invention.
Figure 2G:
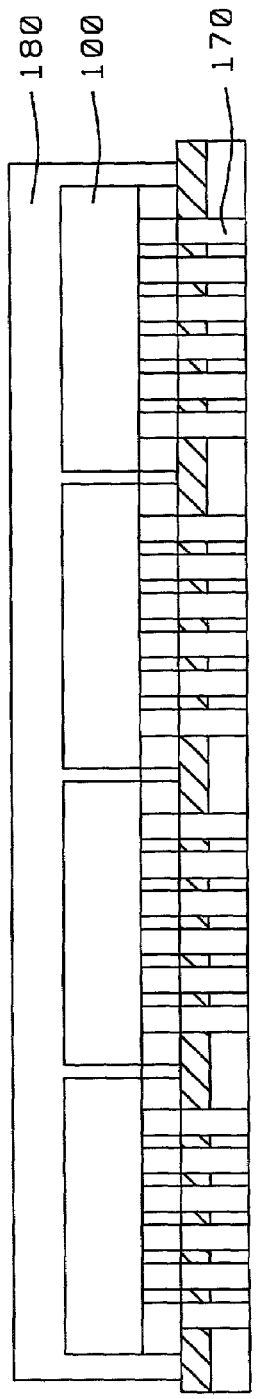
FIG. 2g is a cross-sectional view of a portion of the chip package of FIG. 2f showing the encapsulation of the same, according to the present invention.

It is important that the vias in the adsubstrate align with the I/O pads on the chip, for at the next key step, the chips are attached to the adsubstrate to form a chip package, reference numeral (105), as shown in FIG. 2f such that the vias (170) reach the I/O pads. The attachment is achieved by subjecting the chip package to an assembly pressure between about 1.5 to 2.5 Megapascals (Mpa) and at the same time, to a temperature between about 250 to 350° C. Next, the chip package assembly is encapsulated with a molding material (180), preferably, epoxy based resin to a thickness between about 100 to 500 μm, as shown in FIG. 2g. It will be obvious to those skilled in the art that other molding materials for electronics can also be used.

It is now a main feature of the present invention to perform ball mounting over the via openings of the adsubstrate, where the chip package is inverted such that the mounting material (190), preferably, solder is "balled" up as shown in FIG. 2h. It is further preferred that the solder (190) comprises tin-lead, or, tin-silver alloy. During continued process, solder flows to reach the I/O pads at the bottom of the vias, as shown in FIG. 2h. As a final step, the encapsulated chip package is die sawed to form the Chip Scale Package (CSP) of the present invention, as shown in FIG. 2i. FIG. 2j shows an alternate method of silk screening an adhesive material on to substrate (167) with holes corresponding to the AA I/O pads on the chip. That is, FIG. 2j is a top view of a portion of the patterned stencil where solid areas (161) prevent the adhesive material (160) printing to the substrate (150) while open areas (163) allow the adhesive material (160) to print on the substrate (150), thus forming the adsubstrate (165) of FIG. 2e.

Figure 3E:
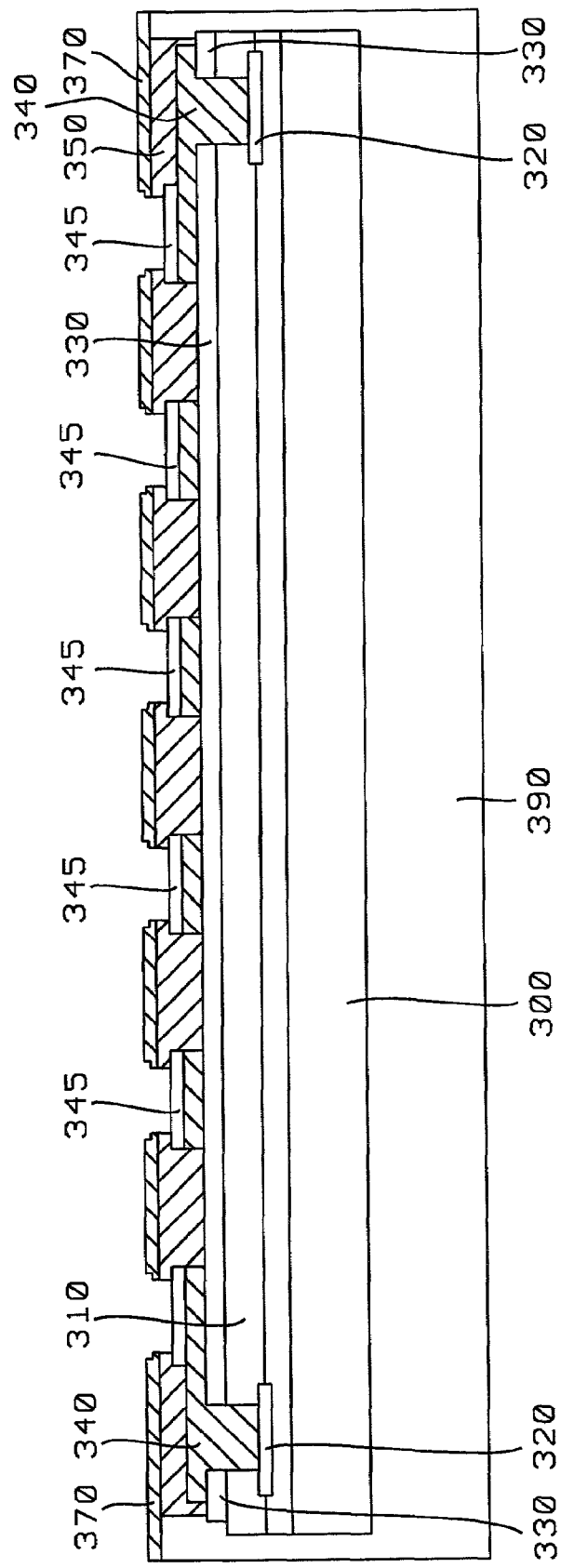
FIG. 3e is a cross-sectional view of a portion of the wafer of FIG. 3d, showing the encapsulation in a molding material, according to the present invention.

In a second embodiment shown in FIGS. 3a-3f, the main feature is where the adhesive material is applied to wafer (300) to form an "adwafer" first. The adwafer, with a plurality of chip sites, has aluminum pads (320) with an optional re-routing (RR) dielectric layer (330) and passivation layer (310) separating the pads from adhesive layer (350), as shown in FIG. 3a. It will be noted that the I/O pads are connected to RR metal layer (340) which redistributes the ordinary pad configuration to an Area Array (AA) pad configuration where the redistributed AA pads are terminated with a barrier metal (345), which acts as an under-ball metallurgy (UBM) as seen in both FIGS. 3a and 3b. It is preferred that the UBM comprises copper and nickel, and has a thickness between about 1 to 50 μm. The adhesive film can be formed on the wafer by either spin coating, screen printing or lamination under pressure, where the latter is preferred.

Openings (360) in adhesive layer (350) reaching barrier metal (345) are next formed by either laser drilling, photolithographic methods, or by silk screening the AA configuration onto the adhesive layer in the first place. It is preferred that laser drilling is employed in this instance. The adwafer so prepared is then diced into Chip Scale Packages, or, CSPs.

Figure 3F:
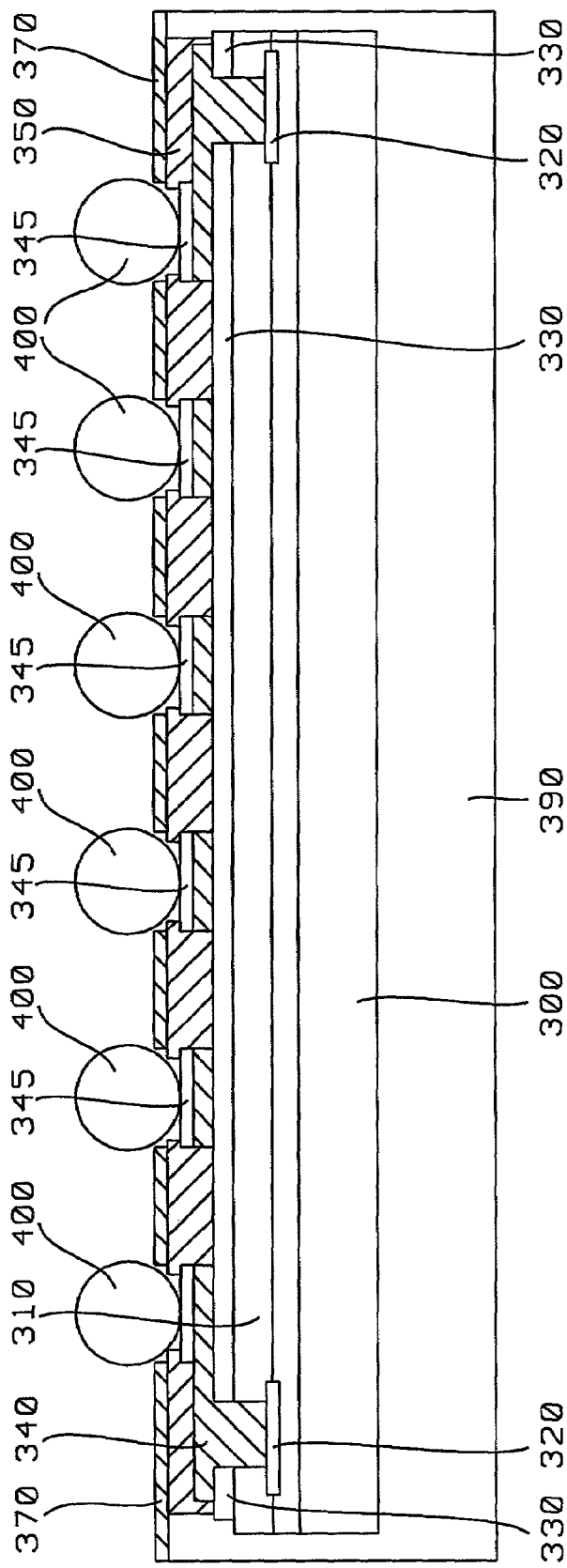
FIG. 3f is a cross-sectional view of a portion of the encapsulated wafer package showing the forming of ball mounts, according to the present invention.

As a key aspect of the second embodiment, a substrate (370), similar to the BGA substrate (150) used in the first embodiment, is next prepared with drilled via openings (380) corresponding to the AA pad array on the CSPs to be attached as shown in FIG. 3c. It is preferred that substrate (370) comprises BT and has a thickness between about 150 to 300 μm. Then the CSP of FIG. 3b is die attached to substrate (370), as shown in FIG. 3d. This is accomplished at a pressure between about 1.5 to 2.5 Mpascals and temperature between about 250 to 350° C. The resulting package is next encapsulated with a molding material (390) using a molding process as shown in FIG. 3e. This is followed by another key feature of the second embodiment, namely, a reflow ball mounting process is performed to form a solder (400) over openings (360) and connected to the AA I/O pads of the chip sites within the wafer, as shown in FIG. 3f. This is accomplished by forming solder (400) comprising tin-lead or tin-silver alloy.

Figure 4:
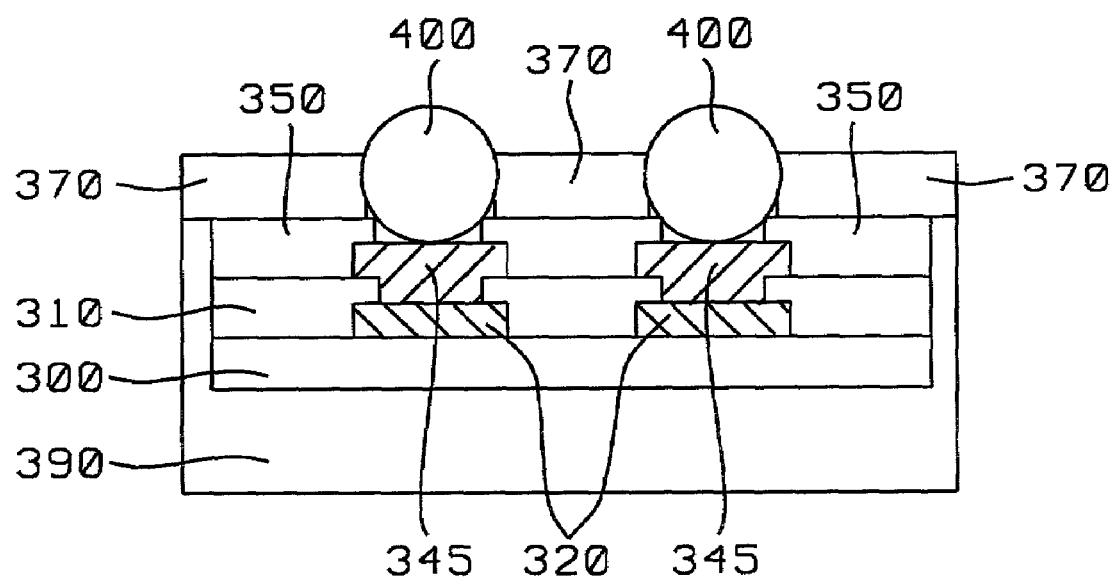
FIG. 4 is a cross-sectional view of a Chip Scale Package (CSP) of the present invention, showing that the invention can perform on a chip designed without the area array pads, and with no distribution layer, according to the present invention.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example forming a CSP product without a re-routing metal layer which is replaced by an UBM layer such as shown in FIG. 4.

It will thus be apparent to those skilled in the art that the disclosed invention can improve the performance of the various levels of packaging in computers through the use of solder connections in place of wire bonding. At the same time, the disclosed Chip Scale Packaging (CSP) can improve the testing cost by keeping the same body size of chip using the same size substrate. The conventional CSP's on the other hand, have varying body sizes, and therefore, requiring different test fixtures. Even more varying sizes are expected with shrinking product sizes, especially with memory products, and hence, large over-head expenditures for the well-known back-end testing on the production line. This is not the case with the uniformly formed CSPs of the present invention. The presently disclosed CSP's can also provide improved thermal reliability by encapsulating the chips with molding materials that will reduce the coefficient of thermal expansion (CTE) mismatch between the silicon chip and the next level of packaging. Hence, molding materials other than those described here may also be used without departing from the letter and spirit of the invention.

That is, while the invention has been particularly shown and described with reference to the preferred embodiments thereof, it will be understood by those skilled in the art that various changes in form and details may be made without departing from the spirit and scope of the invention.

What is claimed is:

1. A method of fabricating a chip package comprising the steps of:
   separating a wafer into multiple dies;
   after said separating said wafer, joining one of said multiple dies and a substrate, wherein an opening in said substrate exposes said one of said multiple dies;
   depositing a tin-containing ball into said opening in said substrate; and
   after said joining said one of said multiple dies and said substrate, separating said substrate into multiple portions.

2. The method of claim 1, wherein said one of said multiple dies comprises a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, wherein said overlying metal layer is on said multiple pads exposed by said multiple openings in said passivation layer, and wherein said opening in said substrate exposes said overlying metal layer in the step of said joining said one of said multiple dies and said substrate.

3. The method of claim 2, wherein said overlying metal layer comprises copper.

4. The method of claim 2, wherein said overlying metal layer comprises nickel.

5. The method of claim 1, wherein said opening in said substrate is formed before said joining said one of said multiple dies and said substrate.

6. The method of claim 1, wherein said one of said multiple dies comprises a semiconductor substrate, multiple integrated circuit devices on said semiconductor substrate, multiple pads, multi-level underlying metal layers under said multiple pads, multiple insulating dielectric layers intervening said multi-level underlying metal layers, and a passivation layer, wherein said multiple pads are connected to said multiple integrated circuit devices through said multi-level underlying metal layers, wherein multiple openings in said passivation layer are over said multiple pads and expose said multiple pads, and wherein said opening in said substrate is over one of said multiple pads after said joining said one of said multiple dies and said substrate.

7. The method of claim 1, wherein said one of said multiple dies comprises a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, wherein said overlying metal layer is over said passivation layer, and wherein said opening in said substrate exposes said overlying metal layer in the step of said joining said one of said multiple dies and said substrate.

8. The method of claim 1 further comprising depositing an adhesive material on said substrate, followed by said joining said one of said multiple dies and said substrate using said adhesive material.

9. The method of claim 1, after said joining said one of said multiple dies and said substrate, further comprising encapsulating said one of said multiple dies with a molding material.

10. The method of claim 1, wherein said substrate comprises bismaleimide triazine (BT).

11. The method of claim 1, wherein said tin-containing ball comprises a tin-silver alloy.

12. The method of claim 1, wherein said opening in said substrate is formed using a process comprising mechanical drilling before said joining said one of said multiple dies and said substrate.

13. The method of claim 1, wherein said opening in said substrate is formed using a process comprising laser drilling before said joining said one of said multiple dies and said substrate.

14. The method of claim 1, wherein said substrate has a thickness between 150 and 300 micrometers.

15. A method of fabricating a chip package comprising the steps of:
providing a first die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, and a passivation layer, wherein said multiple pads are connected to said multiple integrated circuit devices through said multi-level underlying metal layers, and wherein multiple openings in said passivation layer are over said multiple pads and expose said multiple pads;
depositing an adhesive material on a substrate;
joining a first side of said first die and said substrate using said adhesive material, wherein a first opening in said substrate exposes said first side of said first die, wherein said first opening in said substrate is over one of said multiple pads, and wherein said passivation layer is at said first side;
joining a first side of a second die and said substrate using said adhesive material, wherein a second opening in said substrate exposes a said first side of said second die;
encapsulating a second side and sidewall of said first die, a second side and sidewall of said second die, and a gap between said first and second dies with a molding material, wherein said second side of said first die is opposite to said first side of said first die, and said second side of said second die is opposite to said first side of said second die, wherein said gap is filled completely with said molding material, and wherein said molding material has a surface with a first region over said gap and multiple second regions over said second side of said first die and over said second side of said second die, wherein said first region is at a same horizontal level as said multiple second regions; and
after said encapsulating said second side and sidewall of said first die, said second side and sidewall of said second die, and said gap between said first and second dies with said molding material, separating said molding material and said substrate into multiple portions to form said chip package, wherein said separating said molding material and said substrate comprises a sawing process.

16. The method of claim 15, wherein said first die further comprises an overlying metal layer on said multiple pads exposed by said multiple openings in said passivation layer, and said first opening in said substrate exposes said overlying metal layer in the step of said joining said first side of said first die and said substrate.

17. The method of claim 16, wherein said overlying metal layer comprises copper.

18. The method of claim 16, wherein said overlying metal layer comprises nickel.

19. The method of claim 15, after said encapsulating said second side and sidewall of said first die, said second side and sidewall of said second die, and said gap between said first and second dies with said molding material, further comprising forming a tin-containing ball connected to said first die through said first opening in said substrate, wherein said tin-containing ball comprises a tin-silver alloy.

20. The method of claim 15, wherein said first die further comprises an overlying metal layer over said passivation layer, and said first opening in said substrate exposes said overlying metal layer in the step of said joining said first side of said first die and said substrate.

21. The method of claim 15, wherein said molding material comprises a polymer.

22. The method of claim 15, wherein said substrate has a thickness between 150 and 300 micrometers.

23. The method of claim 15, wherein said first opening is formed before said joining said first side of said first die and said substrate.

24. The method of claim 15, wherein said substrate comprises bismaleimide triazine (BT).

25. The method of claim 15, after said joining said first side of said first die and said substrate, further comprising forming a metal conductor through said first opening in said substrate.

26. The method of claim 15, after said encapsulating said second side and sidewall of said first die, said second side and sidewall of said second die, and said gap between said first and second dies with said molding material, further comprising forming a tin-containing ball connected to said first die through said first opening in said substrate.

27. The method of claim 15, wherein said first opening in said substrate is formed using a process comprising laser drilling before said joining said first side of said first die and said substrate.

28. The method of claim 15, wherein said first opening in said substrate is formed using a process comprising mechanical drilling before said joining said first side of said first die and said substrate.

29. The method of claim 15, wherein said depositing said adhesive material on said substrate comprises printing.

30. The method of claim 15, wherein said adhesive material has a thickness between 10 and 100 micrometers.

31. The method of claim 15, wherein said adhesive material comprises polyimide.

32. The method of claim 15, wherein said adhesive material comprises a thermocompression material.

33. The method of claim 15, wherein said molding material comprises resin.

34. The method of claim 15, wherein said molding material comprises epoxy.

35. The method of claim 15, after said encapsulating said second side and sidewall of said first die, said second side and sidewall of said second die, and said gap between said first and second dies with said molding material, further comprising forming a tin-containing ball connected to said first die through said first opening in said substrate, wherein said tin-containing ball comprises a tin-lead alloy.

36. A method of fabricating a chip package comprising the steps of:
providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and a UBM layer, wherein said multiple pads are connected to said multiple integrated circuit devices through said multi-level underlying metal layers, wherein multiple openings in said passivation layer are over said multiple pads and expose said multiple pads, and wherein said UBM layer is on said multiple pads exposed by said multiple openings in said passivation layer;

joining said die and a substrate, wherein an opening in said substrate exposes said UBM layer; and after said joining said die and said substrate, separating said substrate into multiple portions.

37. The method of claim 36, after said joining said die and said substrate, further comprising depositing a conductive material into said opening in said substrate.

38. The method of claim 37, wherein said conductive material comprises tin.

39. The method of claim 37, wherein said conductive material comprises a tin-silver alloy.

40. The method of claim 37, wherein said conductive material comprises a tin-lead alloy.

41. The method of claim 36, after said joining said die and said substrate, further comprising encapsulating said die with a molding material.

42. The method of claim 36 further comprising depositing an adhesive material on said substrate, followed by said joining said die and said substrate using said adhesive material.

43. The method of claim 36, wherein said opening in said substrate is formed before said joining said die and said substrate.

44. The method of claim 36, wherein said UBM layer comprises copper.

45. The method of claim 36, wherein said UBM layer comprises nickel.

46. The method of claim 36, wherein said substrate has a thickness between 150 and 300 micrometers.

47. The method of claim 36, wherein said opening in said substrate is formed using a process comprising laser drilling before said joining said die and said substrate.

48. The method of claim 36, wherein said opening in said substrate is formed using a process comprising mechanical drilling before said joining said die and said substrate.

49. The method of claim 36, wherein said substrate comprises bismaleimide triazine (BT).

50. A method of fabricating a chip package comprising the steps of:

providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, and wherein said overlying metal layer is on said multiple pads;

joining said die and a substrate, wherein an opening in said substrate exposes said overlying metal layer of said die;

after said joining said die and said substrate, forming a metal conductor through said opening in said substrate; and after said joining said die and said substrate, separating said substrate into multiple portions.

51. The method of claim 50, wherein said metal conductor comprises tin.

52. The method of claim 50, wherein said metal conductor comprises a tin-lead alloy.

53. The method of claim 50, wherein said metal conductor comprises a tin-silver alloy.

54. The method of claim 50, wherein said separating said substrate comprises a sawing process.

55. The method of claim 50, after said joining said die and said substrate, further comprising encapsulating said die with an epoxy-based resin.

56. The method of claim 50, wherein said joining said die and said substrate is performed under a pressure between 1.5 and 2.5 Megapascals (Mpa).

57. The method of claim 50, after said joining said die and said substrate, further comprising encapsulating said die with a molding material.

58. The method of claim 50 further comprising depositing an adhesive material on said substrate, followed by said joining said die and said substrate using said adhesive material.

59. The method of claim 50, wherein said opening in said substrate is formed before said joining said die and said substrate.

60. The method of claim 50, wherein said overlying metal layer comprises copper.

61. The method of claim 50, wherein said overlying metal layer comprises nickel.

62. The method of claim 50, wherein said substrate has a thickness between 150 and 300 micrometers.

63. The method of claim 50, wherein said opening in said substrate is formed using a process comprising laser drilling before said joining said die and said substrate.

64. The method of claim 50, wherein said opening in said substrate is formed using a process comprising mechanical drilling before said joining said die and said substrate.

65. The method of claim 50, wherein said substrate comprises bismaleimide triazine (BT).

66. A method of fabricating a chip package comprising the steps of:

providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and a UBM layer, wherein said multiple pads are connected to said multiple integrated circuit devices through said multi-level underlying metal layers, wherein multiple openings in said passivation layer are over said multiple pads and expose said multiple pads, and wherein said UBM layer is on said multiple pads exposed by said multiple openings in said passivation layer;

joining said die and a substrate, wherein an opening in said substrate exposes said UBM layer; and depositing a conductive material into said opening in said substrate.

67. The method of claim 66, wherein said conductive material comprises tin.

68. The method of claim 66, wherein said conductive material comprises a tin-silver alloy.

69. The method of claim 66, wherein said conductive material comprises a tin-lead alloy.

70. The method of claim 66, after said depositing said conductive material, further comprising separating said substrate into multiple portions.

71. The method of claim 66, after said joining said die and said substrate, further comprising encapsulating said die with a molding material.

72. The method of claim 66, further comprising depositing an adhesive material on said substrate, followed by said joining said die and said substrate using said adhesive material.

73. The method of claim 66, wherein said opening in said substrate is formed before said joining said die and said substrate.

74. The method of claim 66, wherein said UBM layer comprises copper.

75. The method of claim 66, wherein said UBM layer comprises nickel.

76. The method of claim 66, wherein said substrate has a thickness between 150 and 300 micrometers.

77. The method of claim 66, wherein said opening in said substrate is formed using a process comprising laser drilling before said joining said die and said substrate.

78. The method of claim 66, wherein said opening in said substrate is formed using a process comprising mechanical drilling before said joining said die and said substrate.

79. The method of claim 66, wherein said substrate comprises bismaleimide triazine (BT).

80. A method of fabricating a chip package comprising the steps of:
providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, and wherein said overlying metal layer is over said passivation layer; and
joining said die and a substrate, wherein an opening in said substrate exposes said overlying metal layer.

81. The method of claim 80, wherein said opening in said substrate is formed before said joining said die and said substrate.

82. The method of claim 80, after said joining said die and said substrate, further comprising separating said substrate into multiple portions.

83. The method of claim 80, after said joining said die and said substrate, further comprising encapsulating said die with an epoxy-based resin.

84. The method of claim 80, after said joining said die and said substrate, further comprising encapsulating said die with a molding material.

85. The method of claim 80 further comprising depositing an adhesive material on said substrate, followed by said joining said die and said substrate using said adhesive material.

86. The method of claim 80, after said joining said die and said substrate, further comprising depositing a conductive material into said opening in said substrate.

87. The method of claim 86, wherein said conductive material comprises tin.

88. The method of claim 86, wherein said conductive material comprises a tin-silver alloy.

89. The method of claim 80, wherein said overlying metal layer comprises nickel.

90. The method of claim 80, wherein said substrate has a thickness between 150 and 300 micrometers.

91. The method of claim 80, wherein said opening in said substrate is formed using a process comprising laser drilling before said joining said die and said substrate.

92. The method of claim 80, wherein said opening in said substrate is formed using a process comprising mechanical drilling before said joining said die and said substrate.

93. The method of claim 80, wherein said substrate comprises bismaleimide triazine (BT).

94. A method of fabricating a chip package comprising the steps of:
providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, and a passivation layer, wherein said multiple pads are connected to said multiple integrated circuit devices through said multi-level underlying metal layers, and wherein multiple openings in said passivation layer are over said multiple pads and expose said multiple pads;
depositing an adhesive material on a substrate;
joining a first side of said die and said substrate using said adhesive material, wherein an opening in said substrate exposes said first side of said die, and wherein said passivation layer is at said first side;
after said joining said first side of said die and said substrate, encapsulating a second side and sidewall of said die with a molding material, wherein said second side of said die is opposite to said first side of said die; and
after said encapsulating said second side and sidewall of said die with said molding material, separating said molding material and said substrate into multiple portions to form said chip package, wherein said separating said molding material and said substrate comprises a sawing process.

95. The method of claim 94, wherein said opening in said substrate is formed before said joining said first side of said die and said substrate.

96. The method of claim 94, wherein said molding material comprises a polymer.

97. The method of claim 94, after said joining said first side of said die and said substrate, further comprising forming a metal conductor through said opening in said substrate.

98. The method of claim 94, after said encapsulating said second side and sidewall of said die with said molding material, further comprising forming a tin-containing ball connected to said die through said opening in said substrate.

99. The method of claim 94, wherein said substrate has a thickness between 150 and 300 micrometers.

100. The method of claim 94, wherein said opening in said substrate is formed using a process comprising laser drilling before said joining said first side of said die and said substrate.

101. The method of claim 94, wherein said opening in said substrate is formed using a process comprising mechanical drilling before said joining said first side of said die and said substrate.

102. The method of claim 94, wherein said substrate comprises bismaleimide triazine (BT).

103. The method of claim 94, wherein said depositing said adhesive material on said substrate comprises printing.

104. The method of claim 94, wherein said adhesive material has a thickness between 10 and 100 micrometers.

105. The method of claim 94, wherein said adhesive material comprises polyimide.

106. The method of claim 94, wherein said adhesive material comprises a thermocompression material.

107. The method of claim 94, wherein said molding material comprises resin.

108. The method of claim 94, wherein said molding material comprises epoxy.

109. The method of claim 94, after said encapsulating said second side and sidewall of said die with said molding material, further comprising forming a tin-containing ball connected to said die through said opening in said substrate, wherein said tin-containing ball comprises a tin-silver alloy.

110. A method of fabricating a chip package comprising the steps of:
- separating a wafer into multiple dies, wherein one of said multiple dies comprises a semiconductor substrate, multiple integrated circuit devices on said semiconductor substrate, multiple pads, multi-level underlying metal layers under said multiple pads, multiple insulating dielectric layers intervening said multi-level underlying metal layers, and a passivation layer, wherein said multiple pads are connected to said multiple integrated circuit devices through said multi-level underlying metal layers, and wherein multiple openings in said passivation layer are over said multiple pads and expose said multiple pads;
- after said separating said wafer, joining a first side of said one of said multiple dies and a substrate, wherein an opening in said substrate exposes said first side of said one of said multiple dies, and wherein said passivation layer is at said first side;
- after said joining said first side of said one of said multiple dies and said substrate, forming a metal conductor through said opening in said substrate;
- after said joining said first side of said one of said multiple dies and said substrate, encapsulating a second side and sidewall of said one of said multiple dies with a molding material, wherein said first side of said one of said multiple dies is opposite to said second side of said one of said multiple dies; and
- after said encapsulating said second side and sidewall of said one of said multiple dies with said molding material, separating said molding material and said substrate into multiple portions to form said chip package, wherein said separating said molding material and said substrate comprises a sawing process.

111. The method of claim 110, wherein said one of said multiple dies further comprises an overlying metal layer on said multiple pads exposed by said multiple openings in said passivation layer, and said opening in said substrate exposes said overlying metal layer in the step of said joining said first side of said one of said multiple dies and said substrate.

112. The method of claim 111, wherein said overlying metal layer comprises copper.

113. The method of claim 111, wherein said overlying metal layer comprises nickel.

114. The method of claim 110, wherein said opening in said substrate is formed before said joining said first side of said one of said multiple dies and said substrate.

115. The method of claim 110, wherein said metal conductor comprises a tin-lead alloy.

116. The method of claim 110, wherein said joining said first side of said one of said multiple dies and said substrate is performed under a pressure between 1.5 and 2.5 Megapascals (Mpa).

117. The method of claim 110 further comprising depositing an adhesive material on said substrate, followed by said joining said first side of said one of said multiple dies and said substrate using said adhesive material.

118. The method of claim 117, wherein said depositing said adhesive material on said substrate comprises printing.

119. The method of claim 117, wherein said adhesive material has a thickness between 10 and 100 micrometers.

120. The method of claim 117, wherein said adhesive material comprises polyimide.

121. The method of claim 117, wherein said adhesive material comprises a thermocompression material.

122. The method of claim 110, wherein said molding material comprises a polymer.

123. The method of claim 110, wherein said substrate has a thickness between 150 and 300 micrometers.

124. The method of claim 110, wherein said substrate comprises bismaleimide triazine (BT).

125. The method of claim 110, wherein said metal conductor comprises tin.

126. The method of claim 110, wherein said opening in said substrate is formed using a process comprising mechanical drilling before said joining said first side of said one of said multiple dies and said substrate.

127. The method of claim 110, wherein said opening in said substrate is formed using a process comprising laser drilling before said joining said first side of said one of said multiple dies and said substrate.

128. The method of claim 110, wherein said molding material comprises resin.

129. The method of claim 110, wherein said molding material comprises epoxy.

130. The method of claim 110, wherein said metal conductor comprises a tin-silver alloy.

131. A method of fabricating a chip package comprising the steps of:
- providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, and wherein said overlying metal layer is over said passivation layer;
- joining said die and a substrate, wherein an opening in said substrate exposes said overlying metal layer; and
- forming a metal conductor through said opening in said substrate, wherein said metal conductor is used to connect said die to an external circuitry.

132. The method of claim 131, after said joining said die and said substrate, further comprising encapsulating said die with a molding material.

133. A method of fabricating a chip package comprising the steps of:
- providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and an overlying metal layer, wherein said multiple pads are connected to said multiple integrated circuit devices through said multi-level underlying metal layers, wherein multiple openings in said passivation layer are over said multiple pads and expose said multiple pads, wherein said overlying metal layer is on said multiple pads exposed by said multiple openings in said passivation layer, and wherein said overlying metal layer comprises nickel;
- depositing an adhesive material on a substrate;
- after said depositing said adhesive material, joining said die and said substrate using said adhesive material, wherein an opening in said substrate exposes said overlying metal layer; and
- after said joining said die and said substrate, forming a metal conductor through said opening in said substrate.

134. The method of claim 133, wherein said opening in said substrate is formed before said joining said die and said substrate.

135. The method of claim 133, wherein said substrate comprises bismaleimide triazine (BT).

136. The method of claim 133, after said forming said metal conductor through said opening in said substrate, further comprising separating said substrate into multiple portions.

137. The method of claim 133, after said joining said die and said substrate, further comprising encapsulating said die with a molding material.

138. A method of fabricating a chip package comprising the steps of:
 providing a die, separated from a wafer, comprising a semiconductor substrate, multiple integrated circuit devices on said semiconductor substrate, multiple pads, multi-level underlying metal layers under said multiple pads, multiple insulating dielectric layers intervening said multi-level underlying metal layers, a passivation layer and a UBM layer, wherein said multiple pads are connected to said multiple integrated circuit devices through said multi-level underlying metal layers, wherein multiple openings in said passivation layer are over said multiple pads and expose said multiple pads, and wherein said UBM layer is on said multiple pads exposed by said multiple openings in said passivation layer;
 joining said die and a substrate, wherein an opening in said substrate exposes said UBM layer;
 after said joining said die and said substrate, depositing a conductive material into said opening in said substrate, wherein said conductive material is used to connect said die to an external circuitry; and
 after said depositing said conductive material, separating said substrate into multiple portions.

139. The method of claim 138, wherein said UBM layer comprises copper.

140. The method of claim 138, wherein said UBM layer comprises nickel.

141. The method of claim 138, after said joining said die and said substrate, further comprising encapsulating said die with a molding material.

* * * * *